(12) United States Patent
Norman et al.

(10) Patent No.: US 8,130,549 B2
(45) Date of Patent: Mar. 6, 2012

(54) APPARATUS AND METHOD FOR DETECTING OVER-PROGRAMMING CONDITION IN MULTISTATE MEMORY DEVICE

(75) Inventors: Robert D. Norman, San Jose, CA (US); Christophe J. Chevallier, Palo Alto, CA (US)

(73) Assignee: Round Rock Research, LLC, Mt. Kisco, NY (US)

( * ) Notice: Subject to any disclaimer, the term of this patent is extended or adjusted under 35 U.S.C. 154(b) by 820 days.

(21) Appl. No.: 11/640,654

(22) Filed: Dec. 18, 2006

(65) Prior Publication Data

US 2007/0101184 A1    May 3, 2007

Related U.S. Application Data

(60) Continuation of application No. 10/629,279, filed on Jul. 29, 2003, now Pat. No. 7,457,997, which is a division of application No. 09/641,693, filed on Aug. 18, 2000, now Pat. No. 6,601,191, which is a continuation of application No. 09/031,391, filed on Feb. 26, 1998, now Pat. No. 6,112,314, which is a continuation of application No. 08/736,195, filed on Oct. 24, 1996, now Pat. No. 5,771,346.

(51) Int. Cl.
*G11C 11/34* (2006.01)

(52) U.S. Cl. .................. 365/185.09; 365/184

(58) Field of Classification Search ............ 365/185.09, 365/184
See application file for complete search history.

(56) References Cited

U.S. PATENT DOCUMENTS

| | | | |
|---|---|---|---|
| 4,653,023 A | 3/1987 | Suzuki et al. | |
| 4,943,948 A * | 7/1990 | Morton et al. | 365/185.21 |
| 5,043,940 A * | 8/1991 | Harari | 365/185.03 |
| 5,142,496 A | 8/1992 | Van Buskirk | |
| 5,153,880 A | 10/1992 | Owen et al. | |
| 5,163,021 A * | 11/1992 | Mehrotra et al. | 365/185.03 |
| 5,218,570 A | 6/1993 | Pascucci et al. | |
| 5,293,560 A | 3/1994 | Harari | |
| 5,321,655 A | 6/1994 | Iwahashi et al. | |
| 5,321,699 A | 6/1994 | Endoh et al. | |
| 5,339,272 A | 8/1994 | Tedrow et al. | |
| 5,386,388 A | 1/1995 | Atwood et al. | |
| 5,394,362 A | 2/1995 | Banks | |
| 5,420,822 A | 5/1995 | Kato et al. | |

(Continued)

OTHER PUBLICATIONS

Chevallier, C., "System for Performing Analog Over-Program and Under-Program Detection for a Multistate Memory Cell", Pending U.S. Appl. No. 09/652,802, filed Aug. 31, 2000.

(Continued)

*Primary Examiner* — Hoai V Ho
*Assistant Examiner* — Jay Radke
(74) *Attorney, Agent, or Firm* — Lerner, David, Littenberg, Krumholz & Mentlik, LLP (57) ABSTRACT

A system embodiment comprises a nonvolatile memory device, a memory, and a controller. The nonvolatile memory device includes a plurality of nonvolatile memory cells. Each nonvolatile memory cell is adapted to store at least two bits. The memory is adapted to store a program when the system powers up. The controller is adapted to implement the program to provide instructions used to program and erase nonvolatile memory cells. A method embodiment comprises loading a program into memory upon powering up a memory system, and implementing the program using a controller, including programming and erasing multi-bit nonvolatile memory cells.

24 Claims, 5 Drawing Sheets

U.S. PATENT DOCUMENTS

| | | | |
|---|---|---|---|
| 5,434,825 A | 7/1995 | Harari | |
| 5,469,444 A | 11/1995 | Endoh et al. | |
| 5,495,442 A | 2/1996 | Cernea et al. | |
| 5,523,972 A | 6/1996 | Rashid et al. | |
| 5,524,231 A * | 6/1996 | Brown | 711/101 |
| 5,539,690 A * | 7/1996 | Talreja et al. | 365/185.22 |
| 5,544,356 A * | 8/1996 | Robinson et al. | 707/205 |
| 5,555,204 A | 9/1996 | Endoh et al. | |
| 5,566,125 A | 10/1996 | Fazio et al. | |
| 5,570,315 A | 10/1996 | Tanaka et al. | |
| 5,581,198 A * | 12/1996 | Trimberger | 326/38 |
| 5,583,812 A | 12/1996 | Harari | |
| 5,602,789 A | 2/1997 | Endoh et al. | |
| 5,608,669 A | 3/1997 | Mi et al. | |
| 5,608,676 A | 3/1997 | Medlock et al. | |
| 5,621,686 A | 4/1997 | Alexis | |
| 5,625,591 A * | 4/1997 | Kato et al. | 365/185.22 |
| 5,627,784 A | 5/1997 | Roohparvar | |
| 5,638,320 A | 6/1997 | Wong et al. | |
| 5,638,326 A | 6/1997 | Hollmer et al. | |
| 5,642,312 A | 6/1997 | Harari | |
| 5,648,934 A | 7/1997 | O'Toole | |
| 5,654,918 A | 8/1997 | Hammick | |
| 5,673,224 A | 9/1997 | Chevallier et al. | |
| 5,684,739 A | 11/1997 | Takeuchi | |
| 5,694,366 A | 12/1997 | Chevallier et al. | |
| 5,729,489 A | 3/1998 | Fazio et al. | |
| 5,737,260 A | 4/1998 | Takata et al. | |
| 5,764,568 A | 6/1998 | Chevallier | |
| 5,764,571 A | 6/1998 | Banks | |
| 5,768,184 A | 6/1998 | Hayashi et al. | |
| 5,768,191 A | 6/1998 | Choi et al. | |
| 5,768,287 A | 6/1998 | Norman et al. | |
| 5,771,346 A | 6/1998 | Norman et al. | |
| 5,790,453 A | 8/1998 | Chevallier et al. | |
| 5,903,504 A | 5/1999 | Chevallier et al. | |
| 5,909,390 A | 6/1999 | Harari | |
| 5,912,838 A | 6/1999 | Chevallier | |
| 5,930,732 A * | 7/1999 | Domanik et al. | 702/31 |
| 5,943,260 A | 8/1999 | Hirakawa | |
| 5,978,289 A | 11/1999 | Merritt | |
| 6,049,899 A | 4/2000 | Auclair et al. | |
| 6,075,738 A | 6/2000 | Takano | |
| 6,078,518 A | 6/2000 | Chevallier | |
| 6,112,314 A | 8/2000 | Norman et al. | |
| 6,163,479 A | 12/2000 | Chevallier | |
| 6,175,937 B1 | 1/2001 | Norman et al. | |
| 6,278,632 B1 | 8/2001 | Chevallier | |
| 6,324,094 B1 | 11/2001 | Chevallier | |
| 6,601,191 B1 | 7/2003 | Norman et al. | |
| 7,457,997 B2 | 11/2008 | Norman et al. | |

OTHER PUBLICATIONS

Lakhani, V., "Method and Apparatus for Programming Multi-State Cells in a Memory Device", U.S. Appl. No. 09/223,087, filed Jun. 19, 2001.

Norman, R., et al., "Apparatus and Method for Detecting Over-Programming Condition in Multistate Memory Device", Pending U.S. Appl. No. 09/641,693, filed Aug. 18, 2000.

* cited by examiner

APPARATUS AND METHOD FOR DETECTING OVER-PROGRAMMING CONDITION IN MULTISTATE MEMORY DEVICE

This application is a continuation of U.S. application Ser. No. 10/629,279, filed Jul. 29, 2003, now U.S. Pat. No. 7,457,997, which is a divisional of U.S. application Ser. No. 09/641,693, filed Aug. 18, 2000, now U.S. Pat. No. 6,601,191, which is a continuation of U.S. application Ser. No. 09/031,391, filed Feb. 26, 1998, now U.S. Pat. No. 6,112,314, which is a continuation of U.S. application Ser. No. 08/736,195 filed Oct. 24, 1996, now U.S. Pat. No. 5,771,346, all of which are incorporated herein by reference in their entirety.

TECHNICAL FIELD

The present invention relates to multistate memory devices, and more specifically, to an apparatus and method for detecting and correcting an over-programming condition in a memory cell of such a device.

BACKGROUND

In conventional single-bit per cell memory devices, the memory cell assumes one of two information storage states, either an "on" state or an "off" state. The binary condition of "on" or "off" defines one bit of information. As a result, a memory device capable of storing n-bits of data requires (n) separate memory cells.

Increasing the number of bits which can be stored using single-bit per cell memory devices depends upon increasing the number of memory cells on a one-for-one basis with the number of bits of data to be stored. Methods for increasing the number of memory bits stored in a memory device composed of single-bit capacity cells have relied upon techniques such as manufacturing larger die which contain more memory cells, or using improved photolithography techniques to build smaller memory cells. Reducing the size of a memory cell allows more cells to be placed on a given area of a single chip.

An alternative to single-bit per cell designs is the storage of multiple-bits of data in a single memory cell. One type of memory in which this approach has been followed is an electrically erasable and programmable device known as a flash memory cell. In flash cells, programming is carried out by applying appropriate voltages to the source, drain, and control gate of the device for an appropriate time period. This causes electrons to tunnel or be injected from a channel region to floating gate. The amount of charge residing on the floating gate determines the voltage required on the control gate in order to cause the device to conduct current between the source and drain regions. This voltage is termed the threshold voltage, $V_{th}$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at a given set of applied voltages, the state of the cell (programmed or erased) can be found.

A multi-bit or multistate flash memory cell is produced by creating multiple, distinct threshold voltage levels within the device. Each distinct threshold voltage corresponds to a set of data bits. This allows multiple bits of binary data to be stored within the same memory cell. When reading the state of the memory cell, each bit set has a corresponding decode value of ones and zeros depending upon the conduction of the device at the threshold voltage level detected. The threshold voltage level for which the cell does not conduct current indicates the bit set representing the data programmed into the cell. Proper data storage requires that the multiple threshold voltage levels of a memory cell be separated from each other by a sufficient amount so that a level of a cell can be programmed or erased in an unambiguous manner. The relationship between the data programmed into the memory cell and the threshold voltage levels of the cell depends upon the data encoding scheme adopted for the cells.

In programming a multistate memory cell, the objective is to apply a programming voltage over a proper time period to store enough charge in the floating gate to move the threshold voltage to a desired level. This level represents a state of the cell corresponding to an encoding of the data which is to be programmed into the cell. It is necessary to be able to program multiple bits (and as a result, multiple memory cells) at the same time in order to produce a commercially desirable memory system which can be programmed within a reasonable amount of time. However, a problem arises when a number of bits are to be programmed at the same time. This is because the characteristics of each bit are different (due to minor variations in the structure and operation of the semiconductor devices which comprise the memory cells), so that variations in the programming speed of different cells will typically occur. This results in bits that become programmed faster than others, and the possibility that some bits will be programmed to a different state (the cell will programmed to a different threshold voltage level) than intended.

As noted, fast programming of multiple memory cells can result in overshooting the desired threshold voltage state of some cells, producing an error in the data being stored. In some flash memory systems, this problem can remain unknown and result in a long (and unproductive) programming cycle. This can occur because the memory system is controlled to carry out the programming operation until the programming data compares with the data applied or a maximum pulse number, voltage, and programming time occur before it aborts and sets an error flag or performs the programming operation at an alternate storage location. In mass storage systems where programming speed is a key performance criteria and lengthy re-programming and erase operations are not desirable, a method for detecting and handling over-programming of bits during programming operations would be more efficient.

In discussing the problem of over-programming of a multistate memory cell, two primary issues need to be addressed: 1) Overshoot in the threshold voltage level of the cell state (programming a cell to a level corresponding to incorrect data) needs to be detected early in the programming operation in order to stop the programming cycle. This eliminates the time wasted in trying to get the memory cells to achieve a verified threshold voltage level; and 2) An over-programmed cell would normally result in a file being marked as bad or obsolete and written elsewhere in the memory array. A procedure that allows recovery (correction) of the bad cells in a multistate device will save the reprogramming effort and boost performance, allowing for more efficient use of the programming time and storage capacity.

The first issue is not a problem when dealing with conventional two-state memory cells. When detecting an erased state compared to a programmed state, the only requirement is to detect that the programming operation progressed far enough that a programmed charge reference level was exceeded, so that the cell would indicate a programmed state when read.

For the two-state memory cell, a program verify sequence consists of carrying out a program operation on the memory cell, then reading the programmed data and comparing it with the desired state (original) of the data being written. If this compare step fails, the cell is given another programming pulse and a compare operation is again performed to see how the programmed data compares with the original data. This sequence is repeated for two-state memory systems until all cells compare, at which time a programming operation is considered successful, or until the number of programming attempts reaches a pre-set limit and the programming operation is aborted.

In multistate memory devices, there are intermediate states that are programmed by setting specific threshold voltage levels within small variations. If the conventional approach to programming is used (a read and compare is performed), a cell that is over-programmed beyond the desired threshold voltage level will never compare properly. The failure of the compare operation will cause the memory cell to be repeatedly programmed, in an attempt to get the error bit to agree to the desired data. The bit failing the compare operation will cause a continuation of the program and compare cycles until the maximum number of programming attempts is reached. This wastes precious time and is an inefficient way of using the memory system.

There is another possible scenario where a memory cell would compare properly during the program verify sequence, but would fail a subsequent read operation because the cell threshold voltage was too high. To account for this possibility, a second verify operation should be performed to check for the upper margin of the cell threshold voltage (note that the standard verify operation checks for the lower margin of the threshold voltage). Circuitry and a method for performing the desired analog verification operations are described in the commonly assigned U.S. patent application Ser. No. entitled "Apparatus for Reading State of Multistate Non-volatile Memory Cells", and "Method for Performing Analog Over-program and Under-program Detection for a Multistate Memory Cell", both filed the same day as this application and the contents of which are hereby incorporated by reference. The above-referenced applications discuss how the data required by the circuitry described in the present application is generated.

What is desired is a means for detecting an over-programming condition in a multistate memory cell. It is also desired to have a means for identifying over-programmed cells and correcting the data programmed in the cell to its intended value.

DETAILED DESCRIPTION

Figure 1:
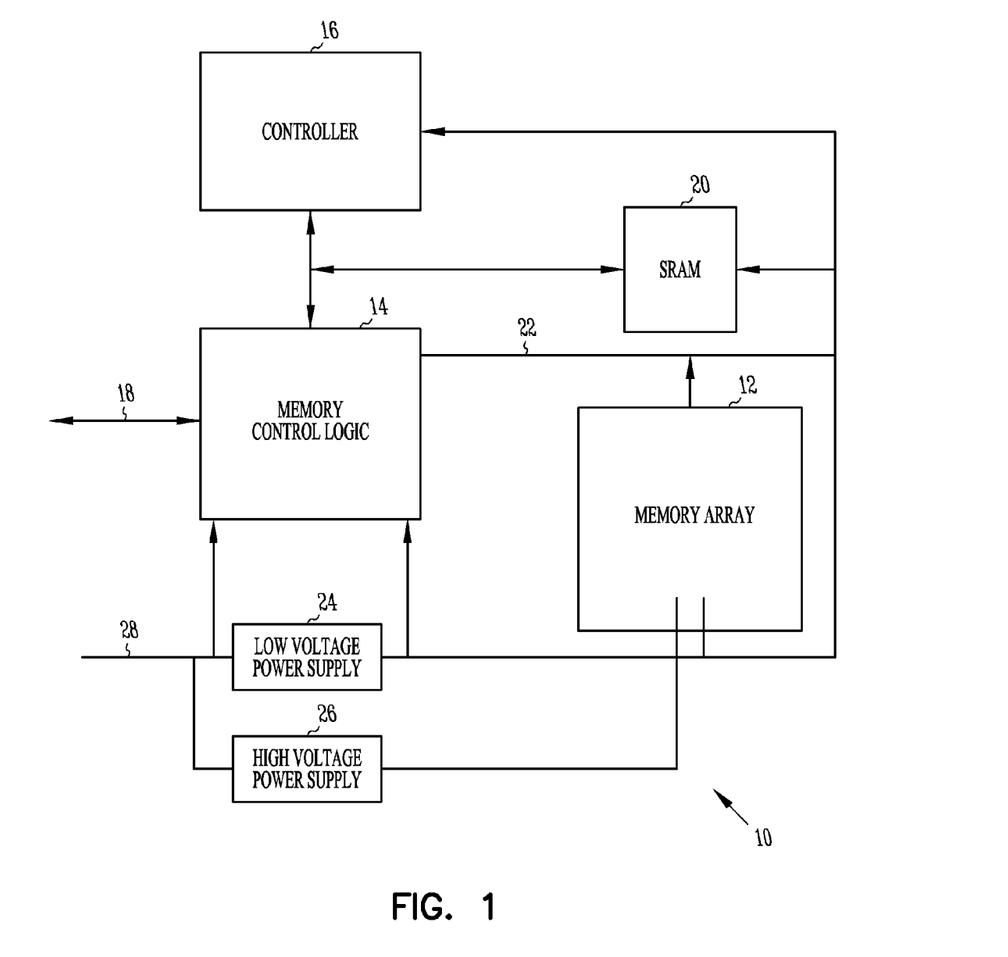
FIG. 1 is a block diagram of a non-volatile memory system which includes the over-program detection circuit of the present invention.

Referring to the drawings, FIG. 1 is a block diagram of a non-volatile memory system 10 which includes the over-program detection circuit of the present invention. Memory system 10 includes non-volatile memory device 12, which is typically in the form of an array of memory cells. The operations of the system, such as the reading, programming, and erasing of the memory cells contained in memory device 12 are controlled by control logic module 14. Control logic module 14 contains, among other circuitry, an internal state machine (ISM) used to sequence the operations performed on the memory cells and high voltage pulse generators used for programming and erasing the cells. In some configurations, control module 14 may also contain sense amplifiers used to read the contents of a cell. Control module 14 receives instructions from micro-controller 16 and communicates with a host processor (not shown) via host interface bus 18.

Static random access memory (SRAM) module 20 contains the program implemented by micro-controller 16 for use in controlling the operations of controller 14 and memory system 10. This program is typically loaded into SRAM module 20 when system 10 is powered up. SRAM module 20 can also contain look up tables used in managing the files of data stored in memory device 12. Memory device bus 22 is used to send control commands from control logic module 14 to memory device 12, and to exchange the data read from or written to memory device 12 with control logic module 14 and the host processor. Power supply module 24 acts to condition operating voltage 28 to provide the source of the low voltages (approximately 3 volts) used for operating memory system 10. Power supply module 26 similarly conditions voltage source 28 to provide the source of the high voltages (approximately 12 volts) used for programming or erasing the memory cells contained in memory device 12. It is noted that power supply module 26 may be implemented in the form of a charge pump or a dc-to-dc converter whose design is based on inductive principles.

Figure 2:
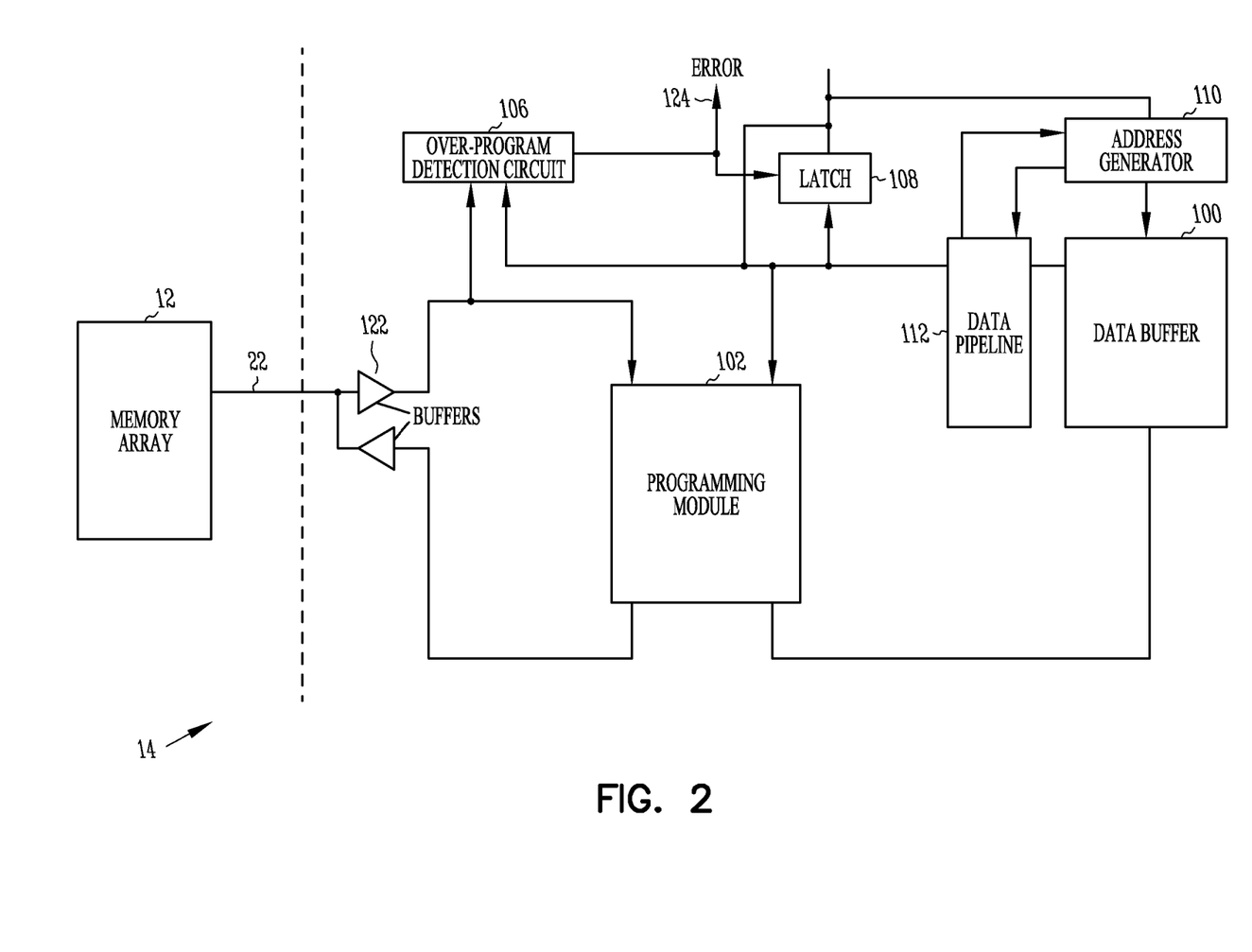
FIG. 2 is a block diagram of the control logic circuitry contained in the non-volatile memory system of FIG. 1, which is used for detecting the over-programming of a memory cell.

FIG. 2 is a block diagram of the circuitry contained in control logic module 14 of the nonvolatile memory system 10 of FIG. 1 which is used for detecting the over-programming of a memory cell. In the figure, control logic module 14 is shown connected to memory device 12 (shown in FIG. 1) via bus 22. Data buffer 100 contains the original data which is intended to be programmed into the memory cells of memory device 12. As the data in each memory cell is read during a programming verify operation (which includes the over-programming condition check), the corresponding data contained in data buffer 100 is also accessed. The two sets of data are compared, a byte at a time, using over-program detection circuitry 106.

As the data programmed into a memory cell is read from memory device 12, and the intended data is read from buffer memory 100, over-program detection circuitry 106 acts on a byte wide data stream in tandem with the programming operations being performed by programming module 102. Programming module 102 executes the data processing operations involved in programming the multistate memory cells. These operations may include, for example, repeated programming cycles followed by comparisons between the programmed data and the desired state of the cells. In this case programming module 102 would access the contents of the memory cells and the data from buffer 100 and then perform comparison and data modification operations using an arithmetic logic unit (ALU) and control elements. During an iterative programming operation, the data would be loaded into a data out register contained in module 102 and sent to memory device 12 via buffers 122. Thus, while programming module 102 is performing the data comparison and modify operations in order to correctly program a cell, over-program detection module 106 is checking to see if the cell has been over-programmed during the cycle.

A multistate byte that contains an over-programmed bit will cause an over-program error flag to be set. This error signal 124 indicates to controller processor 16 that an over-program error has occurred, and causes the byte containing the data to be stored in holding latch 108. As will be described, processor 16 later appends this data to the end of the data stream with a flag indicating its presence. When an error is detected and the byte is no longer valid, processor 16 will force the contents of a data out register contained in programming module 102 to be all ones. This will stop further programming attempts and remove the over-programmed byte from the data checking operations. This has the effect of speeding up the programming operation within the memory device and the system.

Data is gated from buffer 100 starting at the beginning of a sector of memory. Direct memory access (DMA) address generator 110 is responsible for accessing the appropriate data from buffer 100 and works in conjunction with data pipeline 112 to send the data to over-program detection circuitry 106 and programming module 102. As noted, programming module 102 performs data modify and compare operations which are designed to program a memory cell to a desired state.

As noted, data is sent through the ALU contained in programming module 102 and loaded into a data out register. The data is enabled onto flash memory bus 22 via buffers 122 (which are also used in loading data from memory device 12 into over-program detection circuitry 106 and programming module 102), and loaded into flash memory device 12 by means of a strobe pulse on the memory device-controller interface.

A read operation for retrieving data from memory device 12 for purposes of verifying a programming operation or for an over-program detection operation consists of sending the starting address of the desired data from processor 16 to memory device 12 and then strobing the read data into controller 14. As data is brought into controller 14 it is sent through programming module 102 and is then loaded into read pipeline circuitry. The read data is then transferred to data buffer 100 by means of DMA control. The data is checked for errors by error correcting code (ECC) hardware (not shown), allowing controller 14 to correct the data.

As noted, over-program detection module 106 contains the circuitry which implements the over-programming detection operations of the present invention. There are two basic possible approaches to designing an over-program detection circuit. The first is a logic gate implementation for each cell. For a multistate memory cell having four states, the memory system takes two bits of input data and stores these two bits in a memory cell by encoding them in a binary state. One way of encoding the four possible states is shown below:

| Bit 1 Value ($I_B$) | Bit 0 Value ($I_A$) | State |
|---|---|---|
| 1 | 1 | Erased State |
| 1 | 0 | First State |
| 0 | 0 | Second State |
| 0 | 1 | Third State |

Note that bit zero is labeled input bit A ($I_A$) and bit one is labeled input bit B ($I_B$) in the following discussion.

This is one example of a possible encoding scheme for a four state cell. Other encoding methods could be used with adjustments in the circuits to reflect these changes. The above code is used because it assists with error correction (ECC). A state that is in error by one binary value when being read would result in a single bit error instead 2 bit error which would result using a non gray scheme. By adjusting the encoding scheme to reflect the most likely over-programming errors, errors in which the programmed state is one state off on reads will result in a 1 bit error instead of two. The goal of over-programming detection circuit 106 is to detect data read back from the memory device at a higher state than the intended programming data. For example, a value of (1) (0) being programmed into a memory cell would result in an error if states (0) (0) or (0) (1) were detected upon reading back the programmed data. A state of (0) (0) would report an error if a programmed value of (0) (1) was read.

Figure 3:
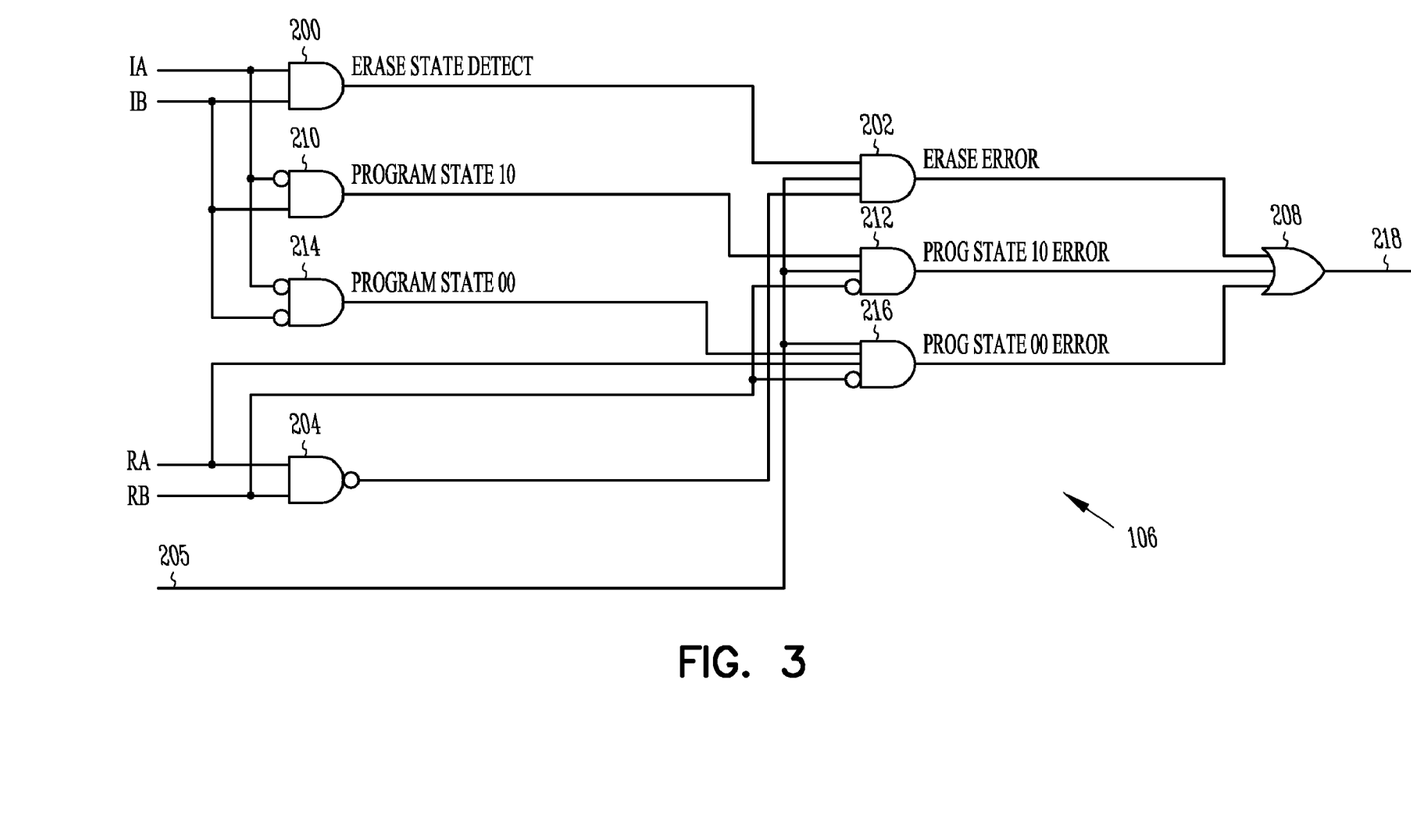
FIG. 3 is a schematic diagram of the over-program detection circuit of the present invention.

FIG. 3 is a schematic diagram of the over-program detection circuit 106 of the present invention. As noted, the erased state is set to have the 2 bit value of (1) (1). The first state checked for by circuit 106 is the erased state. If the original data that was to be contained in the memory cell was indicative of an erased state, then no programming of the cell was required. An over-programming error would result if the cell indicated a state other than an erased state upon reading back its contents. AND gate 200 is used to detect the presence of an erased state in the original data. Initial data bits $I_A$ and $I_B$ corresponding to the original data are obtained from data buffer 100 of FIG. 2 and provided to circuit 106, where they form the inputs for gate 200. With input bits $I_A$ and $I_B$ both high, the output of gate 200 is high. The output of gate 200 is provided as one of the inputs to AND gate 202.

NAND gate 204 is used to detect the presence of a zero in signals $R_A$ and $R_B$, which are the data read back from memory device 12. Note that read back bit zero is labeled bit A ($R_A$) and read back bit one is labeled bit B ($R_B$) in the following discussion.

If either $R_A$ or $R_B$ is a zero, then the data in memory device 12 does not correspond to an erased state, and an error has occurred during the programming operation. With either $R_A$ or $R_B$ zero, the output of NAND gate 204 goes high. This output is provided as one of the inputs to gate 202, in addition to the previously mentioned output of gate 200. A third input to gate 202 is a global enable signal 205. The combination of an erase state (1) (1) being detected by gate 200 and gate 204 detecting a data read back state other than an erased state, along with enable signal 205, results in the output of gate 202 going high. This indicates an erase state over-programming error. The output of gate 202 is provided as an input to OR gate 208. Thus, if the output of gate 202 is high, the output 218 of gate 208 will be high, indicating an over-programming error.

The next over-programming error checked for is the first programming state, represented by the two bit values (1) (0). AND gate 210 is used to detect the presence of the first state in the initial data. Initial data bits $I_A$ and $I_B$ are again obtained from data buffer 100 of FIG. 2 and provided to circuit 106, where they form the inputs for gate 210. Note that $I_A$ is inverted prior to being input to gate 210. A low logic value for input bit $I_A$ and a high value for bit $I_B$ (corresponding to a (1) (0) state) causes the output of gate 210 to be high. The output of gate 210 is provided as one of the inputs to AND gate 212.

Since the program states above the first state are (0) (0) and (0) (1), an over-programming error is present if the value of read back bit $R_B$ is zero. As indicated by the figure, the inverted value of $R_B$ is also provided as an input to gate 212. A third input to gate 212 is global enable signal 205. With $R_B$ being low (corresponding to a value of zero), a high output from gate 210 (indicating a first programming state), and the presence of enable signal 205, the output of gate 212 will be high, indicating the presence of a first programming state over-programming error. The output of gate 212 is provided as an input to OR gate 208. Thus, if the output of gate 212 is high, the output 218 of gate 208 will be high, indicating an over-programming error.

The next over-programming error checked for is the second programming state, represented by the two bit values (0) (0). AND gate 214 is used to detect the presence of the second state in the initial data. Initial data bits $I_A$ and $I_B$ are again obtained from data buffer 100 of FIG. 2 and provided to circuit 106, where they are inverted to form the inputs for gate 214. A low logic value for input bits $I_A$ and $I_B$ causes the output of gate 214 to be high. The output of gate 214 is provided as one of the inputs to AND gate 216.

Since the only program state above the second state is (0) (1), an over-programming error is present if the value of read back bit $R_A$ is one and the value of read back bit $R_B$ is zero. As indicated by the figure, the values of $R_A$ and $R_B$ are also provided as inputs to gate 216. A fourth input to gate 216 is global enable signal 205. With $R_A$ being high (corresponding to a value of one), $R_B$ being low (corresponding to a value of zero), a high output from gate 214, and the presence of enable signal 205, the output of gate 216 will be high, indicating the presence of a second programming state over-programming error. The output of gate 216 is provided as an input to OR gate 208. Thus, if the output of gate 216 is high, the output 218 of gate 208 will be high, indicating an over-programming error.

Over-programming of the third program state (represented by the bit values (0) (1)) is not possible because there are no states having higher threshold voltage values. Thus, no checking for over-programming of this state is required.

The over-program detection circuit of FIG. 3 can be extended to work with memory cells having greater than four programming states. For example, if each memory cell has eight programmable states, then three bits of the data from buffer 100 would be examined, along with three bits of data read back from a cell contained in memory device 12. This process can be extended to other binary based data encoding methods for an increasing number of states. It is noted that one skilled in the art would be capable of designing a logic circuit similar to that of FIG. 3 for use with a multistate memory cell having more than four programming states.

As the number of states which can be programmed into each memory cell increases, the amount of decode logic (such as that shown in FIG. 3) continues to increase. At some point it may become more economical to implement the over-program detection function in the form of a RAM, ROM, EPROM or EEPROM small memory look up table. In this design, data $R_A$, $R_B$, $I_A$, and $I_B$ would be input to a memory element containing the look up table. The look up table would perform the operation of comparing the data intended to be programmed ($I_A$ and $I_B$) with the data read back from the memory device ($R_A$ and $R_B$), with an error signal being produced to indicate an over-programming condition.

While the use of a look up table is straight forward and easy to implement, it may be too costly for some designs. Small memory look up table elements require a lot of die area and are not practical if a large number of bits are being examined. However, this approach could be very attractive for a serial memory with only a few bits being programmed at one time. This look up table approach also offers design flexibility if several different data encoding methods are implemented in a memory, or are required to be supported by a controller which interacts with differing types of memory.

Whichever implementation of the over-program detection circuitry is used, a number of the circuits or look up tables would be required to check more than one memory cell at a time for the presence of an over-programming condition. For example, in order to check each byte of data in parallel, four of the over-program detection circuits shown in FIG. 3 (or a memory containing a corresponding look up table) would be used for a four state memory cell (a sixteen state cell would typically use two over-program detection circuits per byte). Such an implementation would utilize an eight bit data bus. Other configurations in which a greater number of bits are checked in parallel are also possible, subject to the capacity of the data bus. It is noted that the over-programming detection circuitry can be built into the memory devices themselves (placed on the same chip as the memory cells) or can be placed in an off-chip controller for use in performing over-program detection for multiple memory devices. One benefit of placing the detection circuitry in an off-chip controller is that it allows the cost of the circuitry to be amortized over multiple memory devices, instead of duplicating the function in each memory device.

Figure 4:
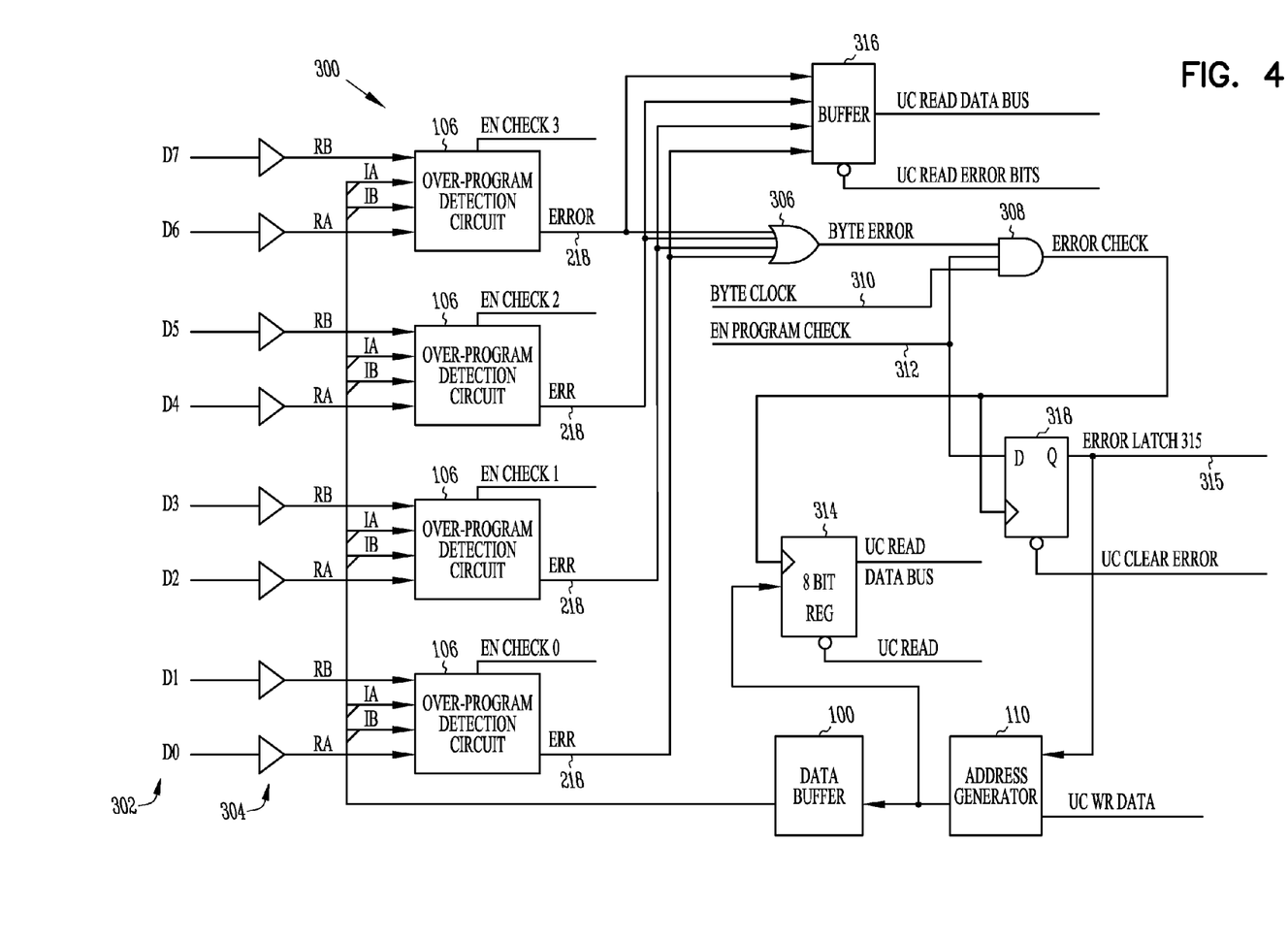
FIG. 4 is a block diagram of a circuit which incorporates the over-program detection circuitry of FIG. 3 and which can be used to check each byte of data for the existence of an over-programming error.

In the configuration to be discussed, an eight bit bus is used and eight bits (one byte) of data is checked for an over-programming condition at a time. Thus, the over-program detection circuitry or look up table is duplicated four times. FIG. 4 is a block diagram of a circuit 300 which incorporates the over-program detection circuitry 106 of FIG. 3 and which can be used to check each byte of data for an over-programming error.

In FIG. 4 the data programmed into each byte of memory device 12 is provided to circuit 300 by means of data inputs 302 (labeled as pins D0 through D7 in the figure). The eight bits of data 302 represents the data contained in four memory cells, with the data from each cell being represented as two bits, $R_A$ and $R_B$. Data buffers 304 are used to load the data into circuit 300. Each pair of bits $R_A$ and $R_B$ serve as an input to one of the four over-program detection circuits 106. A second input to each over-program detection circuit 106 is the data which is intended to be programmed into the memory cells. This data is represented as four pairs of bits $I_A$ and $I_B$ in the figure. The output of each over-program detection circuit 106 is an error signal 218 which indicates if an over-programming error is present in the data being checked.

The design of circuit 300 allows eight bits of data from memory device 12 to be checked for over-programming at the same time. As a byte of data (consisting of bit pairs $R_A$ and $R_B$ for each cell) is read from memory via inputs 302, the original data intended to be programmed into the memory device (bit pairs $I_A$ and $I_B$) is read from data buffer 100, allowing for a direct byte by byte compare. The output 218 of each over-program detection circuit 106 is input to OR gate 306. In the event that one of the memory cells in the byte being checked has been over-programmed, one of the error signals 218 will become active. This will cause the output of gate 306 to be high.

The output of gate 306 is provided as an input to AND gate 308. A second input to gate 308 is a clock signal 310, whose function will be discussed. The third input to gate 308 is a over-program detection enable signal 312. When the output of gate 306 is high (indicating an over-programming error) and clock signal 310 and enable signal 312 are high, the output of gate 308 is high. The over-program error signal (the output of gate 306) is strobed by clock signal 310. The strobed clock signal has two functions. Firstly, it is used to indicate the occurrence of an over-programming error by setting error register 318. This causes a signal to be sent to direct memory access (DMA) address generator 110, interrupting its operation. DMA address generator 110 is responsible for providing the addresses used for accessing the appropriate data from buffer 100. The interruption prevents further checking of the data in the memory device. In addition, the strobed clock signal sets register 314 which contains the address of the byte containing the over-programmed data. The signal from register 318 is sent to the host microprocessor as a status bit and/or interrupt bit by means of data line 315. This notifies the processor of an over-programming error. The processor then executes an operation to read the address of the data containing the over-programming error contained in register 314. The processor then reads buffer 316 which transfers the over-program error signals to the processor, allowing the processor to determine which of the checked bits was over-programmed.

The processor reads the data byte of the original data in memory (using the address supplied by DMA address generator 110) and saves the correct data for the bit pair in the byte that corresponds to the over-programmed bit pair. The processor saves the contents of the two registers for later use. When these two registers have been saved, the processor clears (resets) error register 318, causing the control signal supplied to DMA address generator 110 to go low, which allows the over-programming detection process to continue. The group of bits found to have an error are skipped, as continued processing would be a waste of time. Controller 14 continues to verify the rest of the data for that sector of memory. If other over-program errors are detected, the same halt and save sequence is repeated. At the end of the sector of data, controller 14 appends the saved information to the sector data. As will be discussed, the appended data will be used on future reads of the sector to recover the original data written to the memory cells found to be over-programmed.

Figure 5A:
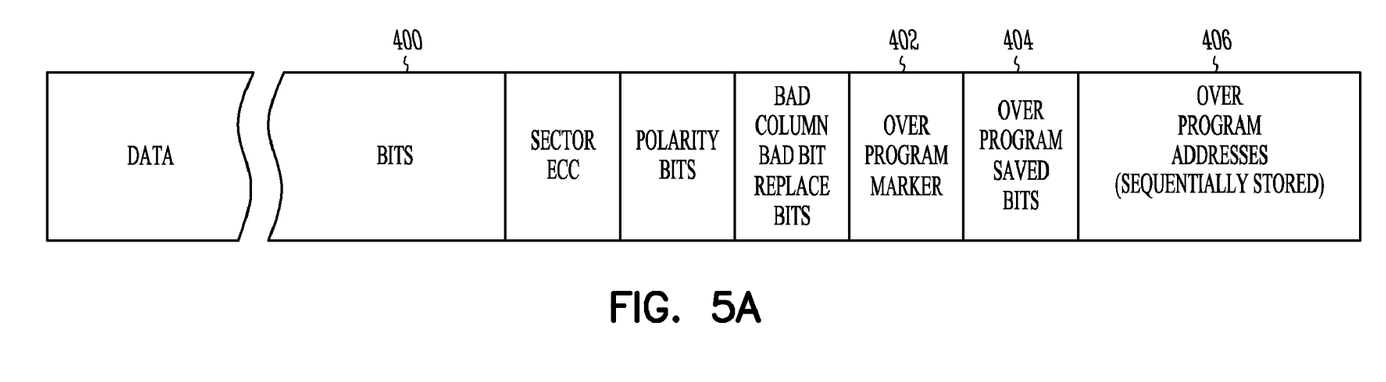
FIGS. 5A and 5B show two possible formats in which the information regarding the over-programmed bits can be appended to the data contained in a data field of the memory device.
Figure 5B:
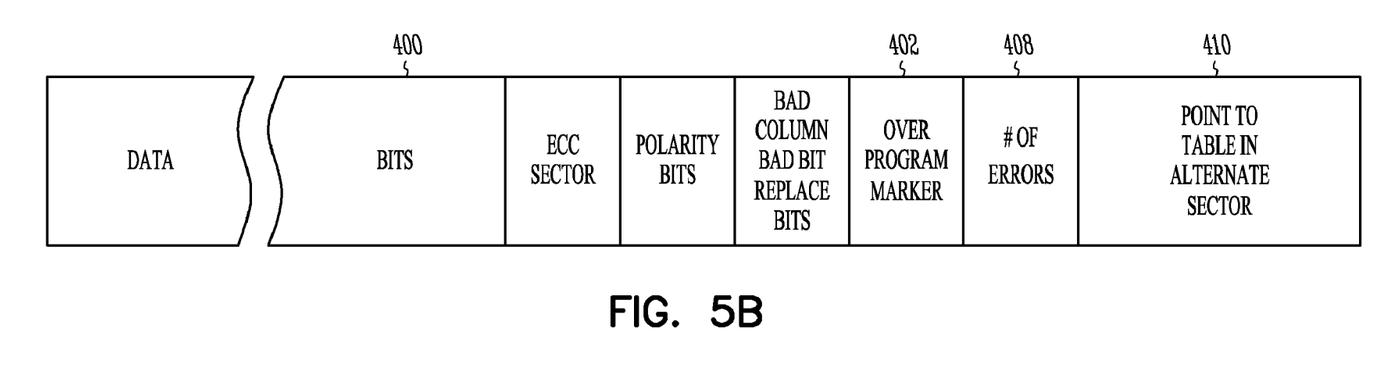

FIGS. 5A and 5B show two possible formats in which the information regarding the over-programmed bits can be appended to the data 400 contained in a sector of the memory device. If there is a minimal number of errors the processor stores a marker 402 indicating that over-program replacement bits 404 are stored. In this format the error replacement bits 404 (the correct data) are stored along with the address and bit location 406 indicating where the replacement bits are to be inserted when reading the data.

If more over-programming errors exist than the row has bits for storing the information in the format shown in FIG. 5A, the system switches to the format of FIG. 5B. In this format, the value of flag 402 indicates that the over-program error data is stored in the alternative data format. Flag 402 is followed by the number of over-programming errors detected 408, and the address 410 of an alternate memory location. Address 410 is a pointer to another location in memory where the replacement bits and associated addresses are stored.

Thus, when over-program errors are detected the present invention compensates for the over-programmed bit locations by storing the correct data bits at alternate locations with address pointers indicating where the correct data is to be inserted. The correct data is then recaptured by the following process.

During a read operation of a sector of memory, the controller first reads the footer area (that section which contains the over-program detection marker, correct data bits, and addresses for replacing the incorrect bits). The controller checks to see if the special overshoot (over-programming error) flags are set, indicating that over-programming error bits are stored and need to be recovered. The overshoot flags are data patterns that describe the format of the stored data. If the flags are not set, a standard read operation is initiated. However, if either of the flags are set a special read recovery sequence is initiated. The controller will read the sector data into a buffer memory. The bad overshoot bits will also be loaded into buffer memory as part of the sector read. After this data is loaded, the controller will replace the detected over-programmed bits with the saved bits, read back at the start of the operation. Once these bits have been substituted in buffer memory, the data in the sector buffer should be correct. These processing operations are similar to those referred to when discussing the operations of programming module 102. The correct data is verified by taking the data from buffer memory and inputting it to the ECC circuitry. After the data has been input to this circuitry, the ECC bits from the memory device are read in and clocked into the ECC circuitry. At the end of this clocking sequence, any errors should be seen by the error detection bits in hardware. If no error is detected, then the data is good and can be sent to the host processor. If an error is detected, then ECC correction will be invoked before sending the data to the host.

In the above read recovery procedure, if the second format of FIG. 5B was detected, an additional step would be required before starting the read data operation. The controller would read the pointer indicating where the over-program information is stored. It will then take this data and have the controller read this location, gathering the replacement bits (the correct data) and the bit address pointers. Once these bits are input and saved in the controller the read recovery operation proceeds as described.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A memory system, comprising:
   a nonvolatile memory device, including a plurality of multi-bit nonvolatile memory cells, each multi-bit nonvolatile memory cell storing at least two bits;
   a memory storing a program when the system powers up; and
   a controller implementing the program to control operations of the non-volatile memory device including providing instructions used to program and erase the at least two bits from each of at least some of the multi-bit nonvolatile memory cells and to manage the at least two bits from each of at least some of the multi-bit nonvolatile memory cells that are over-programmed,
   wherein the controller comprises an error signal generator configured to, for each of at least some of the memory cells:
   receive the at least two bits stored in the memory cell and at least two bits to be programmed in the memory cell, and assert an error signal when the memory cell is over-programmed relative to the at least two bits to be programmed in the memory cell.

2. The system of claim 1, wherein the memory includes a static random access memory (SRAM).

3. The system of claim 2, wherein SRAM includes lookup tables to manage data in the nonvolatile memory device.

4. A memory system, comprising:
a nonvolatile memory device, including a plurality of multi-bit nonvolatile memory cells, each of the plurality of multi-bit nonvolatile memory cells storing at least two bits;
means for loading a program upon startup; and
a controller implementing the program to control operations of the non-volatile memory device including providing instructions used to program and erase the at least two bits from each of at least some of the multi-bit nonvolatile memory cells and to manage the at least two bits from each of at least some of the multi-bit nonvolatile memory cells that are over-programmed,
wherein the controller comprises an error signal generator configured to, for each of at least some of the memory cells:
receive the at least two bits stored in the memory cell and at least two bits to be programmed in the memory cell, and
assert an error signal when the memory cell is over-programmed relative to the at least two bits to be programmed in the memory cell.

5. The system of claim 4, wherein the means for loading a program upon startup includes means for storing the program in the static random access memory (SRAM).

6. The system of claim 5, further comprising means for using tables in the SRAM to manage data in the nonvolatile memory device.

7. A memory system, comprising:
a flash memory device, including a plurality of multi-bit flash memory cells, each multi-bit flash memory cell storing at least two bits;
a static random access memory (SRAM) for storing a program after system power-up; and
a controller connected to the flash memory device and to the SRAM, the controller implementing the program stored in the SRAM to control operations of the flash memory device including managing the at least two bits from each of at least some of the multi-bit flash memory cells that are over-programmed,
wherein the controller comprises an error signal generator configured to, for each of at least some of the memory cells:
receive the at least two bits stored in the memory cell and at least two bits to be programmed in the memory cell, and
assert an error signal when the memory cell is over-programmed relative to the at least two bits to be programmed in the memory cell.

8. The system of claim 7, wherein the controller implements the program stored in the SRAM to control operations of the system.

9. The system of claim 7, wherein the controller implements the program stored in the SRAM to control operations of the flash memory device including providing instructions used to program and erase the at least two bits from each of at least some of the multi-bit flash memory cells.

10. The system of claim 7, wherein the controller uses look up tables in the SRAM to manage files of data stored in the flash memory device.

11. A memory system, comprising:
a multi-bit flash memory device, including a plurality of multi-bit flash memory cells, wherein each multi-bit flash memory cell stores at least two bits;
a static random access memory (SRAM) for storing a program after system power-up; and
a controller connected to the flash memory device and to the SRAM, the controller implementing the program stored, in the SRAM to control operations of the multi-bit flash memory device including providing instructions used to program and erase the at least two bits from each of at least some of the multi-bit flash memory cells and to manage the at least two bits from each of at least some of the multi-bit flash memory cells that are over-programmed,
wherein the controller comprises an error signal generator configured to, for each of at least some of the memory cells:
receive the at least two bits stored in the memory cell and at least two bits to be programmed in the memory cell, and
assert an error signal when the memory cell is over-programmed relative to the at least two bits to be programmed in the memory cell.

12. The system of claim 11, wherein each multi-bit flash memory cell stores two bits.

13. A memory system, comprising:
a multi-bit flash memory device, including a plurality of multi-bit flash memory cells, each multi-bit nonvolatile memory cell storing at least two bits;
a static random access memory (SRAM) for storing a program after system power-up; and
a controller connected to the flash memory device and to the SRAM, the controller implementing the program stored in the SRAM to control operations of the system including managing the at least two bit from each of at least some of the multi-bit flash memory cells that are over-programmed,
wherein the controller comprises an error signal generator configured to, for each of at least some of the memory cells:
receive the at least two bits stored in the memory cell and at least two bits to be programmed in the memory cell, and
assert an error signal when the memory cell is over-programmed relative to the at least two bits to be programmed in the memory cell.

14. The system of claim 13, wherein each multi-bit memory cell stores two bits.

15. The system of claim 13, wherein the controller includes a programming module for programming the multi-bit flash memory device.

16. A memory system, comprising:
a multi-bit flash memory device, including a plurality of multi-bit flash memory cells, wherein each multi-bit memory cell stores at least two bits;
a static random access memory (SRAM) for storing data when the system is powered up; and
a controller connected to the flash memory device and to the SRAM, the controller controlling operations of the system using the data stored in the SRAM, including managing the at least two bits from each of at least some of the multi-bit flash memory cells that are over-programmed,
wherein the controller comprises an error signal generator configured to, for each of at least some of the memory cells:
receive the at least two bits stored in the memory cell and at least two bits to be programmed in the memory cell, and assert an error signal when the memory cell is over-programmed relative to the at least two bits to be programmed in the memory cell.

17. The system of claim 16, wherein the controller controls operations of the multi-bit flash memory device including providing instructions used to program and erase the at least two bits from each of at least some of the multi-bit flash memory cells using the data stored in the SRAM.

18. A method, comprising:
loading a program into memory upon powering up a memory system, wherein the memory system comprises a plurality of multi-bit nonvolatile memory cells, each multi-bit nonvolatile memory cells storing at least two bits;
implementing the program using a controller, including controlling operations of the memory including providing instructions used for programming and erasing the at least two bits from each of at least some of the multi-bit nonvolatile memory cells;
for each of at least some of the memory cells:
receiving the at least two bits stored in the memory cell and at least two bits to be programmed in the memory cell; and
asserting an error signal when the memory cell is over-programmed relative to the at least two bits to be programmed in the memory cell.

19. The method of claim 18, wherein loading the program into memory includes loading the program into a static random access memory (SRAM).

20. A method, comprising:
powering up a memory system, wherein the memory system comprises a plurality of multi-bit nonvolatile memory cells, each multi-bit nonvolatile memory cell storing at least two bits;
storing a program into static random access memory (SRAM) after the memory system is powered up; and
controlling memory system operation using the program, including programming data into at least some of the multi-bit nonvolatile memory cells, wherein controlling memory system operation includes detecting an over-programming state of at least some of the multi-bit nonvolatile memory cells,
wherein detecting the over-programming state comprises, for each of at least some of the memory cells:
receiving the at least two bits stored in the memory cell and at least two bits to be programmed in the memory cell; and
asserting an error signal when the memory cell is over-programmed relative to the at least two bits to be programmed in the memory cell.

21. A method, comprising:
forming a nonvolatile memory device, including forming a plurality of nonvolatile multi-bit memory cells for storing at least two bits;
forming a memory for storing a program after initiating a system power up; and
forming a controller for implementing the program to control operations of the nonvolatile memory device including providing instructions used to program and erase the at least two bits from each of at least some of the nonvolatile multi-bit memory cells and to manage the at least two bits from each of at least some of the multi-bit nonvolatile memory cells that are over-programmed,
wherein the managing the at least two bits comprises, for each of at least some of the memory cells:
receiving the at least two bits stored in the memory cell and at least two bits to be programmed in the memory cell; and
asserting an error signal when the memory cell is over-programmed relative to the at least two bits to be programmed in the corresponding memory cell.

22. The method of claim 21, wherein forming the memory includes forming a static random access memory (SRAM).

23. A method, comprising:
forming a multi-bit flash memory device, including a plurality of multi-bit flash memory cells, wherein each multi-bit flash memory cell stores at least two bits;
forming a static random access memory (SRAM) for storing a program upon system power-up; and
forming a controller connected to the flash memory device and to the SRAM to implement the program stored in the SRAM to control operations of the multi-bit flash memory device including managing the at least two bits from each of at least some of the multi-bit flash memory cells that are over-programmed,
wherein the managing the at least two bits comprises, for each of at least some of the memory cells:
receiving the at least two bits stored in the memory cell and at least two bits to be programmed in the corresponding memory cell; and
asserting an error signal when the memory cell is over-programmed relative to the at least two bits to be programmed into the memory cell.

24. The method of claim 23, wherein forming the multi-bit flash memory device includes forming the plurality of multi-bit flash memory cells to each store two bits.

* * * * *